United States Patent [19]

Hirai et al.

[11] Patent Number: 5,405,454
[45] Date of Patent: Apr. 11, 1995

[54] ELECTRICALLY INSULATED SILICON STRUCTURE AND PRODUCING METHOD THEREFOR

[75] Inventors: Yoshihiko Hirai, Osaka; Kiyoshi Morimoto; Yasuaki Terui, both of Neyagawa; Masaaki Niwa, Hirakata; Juro Yasui, Toyonaka; Kenji Okada, Suita; Masaharu Udagawa, Tokyo; Koichiro Yuki, Neyagawa, all of Japan

[73] Assignee: Matsushita Electric Industrial Co., Ltd., Osaka, Japan

[21] Appl. No.: 30,556

[22] Filed: Mar. 12, 1993

[30] Foreign Application Priority Data

Mar. 19, 1992 [JP] Japan .................. 4-062854

[51] Int. Cl.⁶ .................................... H01L 29/30
[52] U.S. Cl. ........................... 148/33.2; 437/62; 437/63; 437/67; 437/68
[58] Field of Search ............... 437/62, 63, 64, 67, 437/68; 148/33.2, 33

[56] References Cited

U.S. PATENT DOCUMENTS

| | | | |
|---|---|---|---|
| 3,761,785 | 9/1973 | Pruniaux | 437/915 |
| 4,485,551 | 12/1984 | Soclof | 437/62 |
| 4,584,762 | 4/1986 | Soclof | 437/62 |
| 4,611,387 | 9/1986 | Soclof | 437/62 |
| 4,649,627 | 3/1987 | Abernathey et al. | 437/915 |
| 4,857,078 | 7/1989 | Short et al. | 437/62 |
| 5,258,326 | 11/1993 | Morishima et al. | 437/107 |
| 5,262,346 | 11/1993 | Bindal et al. | 437/68 |
| 5,296,719 | 3/1994 | Hirai et al. | 257/14 |
| 5,313,484 | 5/1994 | Arimoto | 372/46 |

FOREIGN PATENT DOCUMENTS

| | | | |
|---|---|---|---|
| 0069191 | 1/1983 | European Pat. Off. | 437/67 |
| 0154141 | 7/1986 | Japan | 437/62 |
| 0229855 | 10/1987 | Japan | 437/62 |
| 0303048 | 12/1990 | Japan | 437/67 |
| 0308540 | 12/1990 | Japan | 437/64 |
| 2308540 | 12/1990 | Japan . | |
| 2308548 | 12/1990 | Japan . | |
| 0034442 | 2/1991 | Japan | 437/62 |
| 0041748 | 2/1991 | Japan | 437/72 |
| 0110855 | 5/1991 | Japan | 437/62 |
| 0240255 | 10/1991 | Japan | 437/62 |

OTHER PUBLICATIONS

Kazuhiro Shimizu, et al "Fabrication of Nanostructure by Anisotropic Wet Etching of Silicon", Japanese Journal of Applied Physics, vol. 27, No. 9, Sep. 1988, pp. L1778–L1779.

X. Iwameji, et al "Fabrication of Thin Silicon Wires by Anisotropic Etching of a SOI Layer" Extended Abstracts (The 37th Spring Meeting, 1990), The Japan Society of Applied Physics and Related Societies, No. 2, 30a–SB–5, p. 613.

Kazuhiro Shimizu, et al "Fabrication of MOS Nanostructure by Employing Electron Beam Lithography and Anisotropic Wet Etching of Silicon", Japanese Journal of Applied Physics, vol. 30, No. 3A, Mar. 1991, pp. L415–L417.

D. G. Hasko, "Fabrication of Submicrometer Free-standing Single–Crystal Gallium Arsenide and Silicon Structures for Quantum Transport Studies", J. Vac. Sci. Technol. B6(6), Nov./Dec. 1988, pp. 1849–1851.

K. Itoh, et al, "Universal Conductance Fluctuations in Mesoscopic n⁺ Si Wires", Anderson Localization, Proceedings of the International Symposium, Tokyo, Japan, Aug. 16–18, 1987, pp. 352–359.

Primary Examiner—Brian E. Hearn
Assistant Examiner—Trung Dang
Attorney, Agent, or Firm—Stevens, Davis, Miller & Mosher

[57] ABSTRACT

A silicon substrate comprises, at least two surfaces extending substantially along respective crystal faces of (111) crystal orientation of the silicon, the crystal faces of (111) crystal orientation crossing with each other, an electrically insulating layer formed by oxidizing the silicon substrate from the surfaces, and an electrically conductive portion insulated electrically by the electrically insulating layer from an outside of the silicon substrate.

15 Claims, 7 Drawing Sheets

FIG. IA
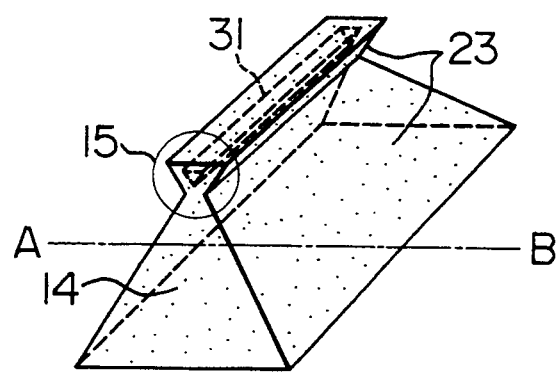
FIG. IB
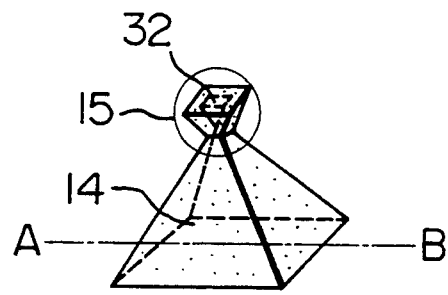
FIG. IC
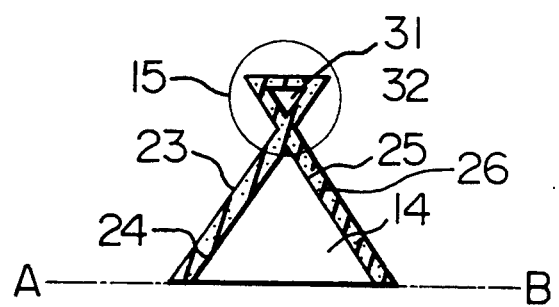

ELECTRICALLY INSULATED SILICON STRUCTURE AND PRODUCING METHOD THEREFOR

BACKGROUND OF THE INVENTION AND RELATED ART STATEMENT

The present invention relates to electrically insulated silicon structures and producing methods therefor. A silicon substrate used in the present invention may be pure without impurity, or may include an impurity. It is important for the present invention to be applied to a crystalline structure as a silicon crystal.

JAPANESE JOURNAL OF APPLIED PHYSICS, VOL. 27, NO. 9, SEPTEMBER, 1988, pp. L1778–L1779 by Shimizu et al. and Extended Abstracts (The 37th Spring Meeting, 1990); The Japan Society of Applied Physics and Related Societies No. 2, 30a-SB-5, page 613 by Iwameji et al. disclose fabrications of fine silicon structures.

In these disclosures, as shown in FIGS. 3A and 3B, a crystal face of (111) crystal orientation which is the most anti-etching or etching-resistant face in the silicon is utilized for forming an outer surface of the silicon structure. When a silicon substrate 10 on which an anti-etching pattern layer 12 is formed through lithography is etched by ethylene-diamine solution or potassium hydroxide solution or the like, side walls 13 extending along the crystal face of the (111) crystal orientation of the silicon remain to form a projection 40 with a trapezoid cross-section.

OBJECT AND SUMMARY OF THE INVENTION

An object of the present invention is to provide an electrically insulated silicon dot or wire whose outer boundary facing an electrically insulating layer has an improved sufficient positional accuracy, flatness and linearity for an electrically conductive or semi-conductive quantum dot or wire.

According to the present invention, a silicon substrate comprises, at least two surfaces extending substantially along respective crystal faces of (111) crystal orientation of the silicon, the crystal faces of (111) crystal orientation crossing with each other, an electrically insulating layer formed by oxidizing the silicon substrate from the surfaces, and an electrically conductive portion insulated electrically by the electrically insulating layer from an outside of the silicon substrate.

According to the present invention, a method for producing an electrically conductive portion of a silicon substrate insulated electrically from an outside of the silicon substrate comprises the steps of etching the silicon substrate to form at least two surfaces of the silicon substrate extending substantially along respective crystal faces of (111) crystal orientation of the silicon, the crystal faces of (111) crystal orientation crossing with each other, and oxidizing the silicon substrate from the surfaces to form an electrically insulating layer and to leave a electrically conductive portion under the electrically insulating layer so that the electrically insulating layer insulates electrically the electrically conductive portion of the silicon substrate from the outside of the silicon substrate.

Since the electrically insulating layer is formed on the electrically conductive portion by oxidizing the silicon substrate from the surfaces extending substantially along the crystal faces of (111) crystal orientation of the silicon, the positional accuracy, flatness and linearity of the outer boundary of the electrically conductive portion facing to the electrically insulating layer are improved by those of the surfaces and are superior to those of the surfaces. Therefore, the boundary between the electrically conductive portion and the electrically insulating layer or an outer surface of the electrically conductive portion is preferable for the electrically conductive or semi-conductive quantum dot or wire.

BRIEF DESCRIPTION OF THE DRAWINGS

FIGS. 1A and 1B are schematic oblique-projection views showing embodiments of the present invention, respectively.

FIG. 1C is a schematic cross-sectional view showing the embodiments of FIGS. 1A and 1B.

DETAILED DESCRIPTION OF THE PREFERRED EMBODIMENTS

Figure 2A:
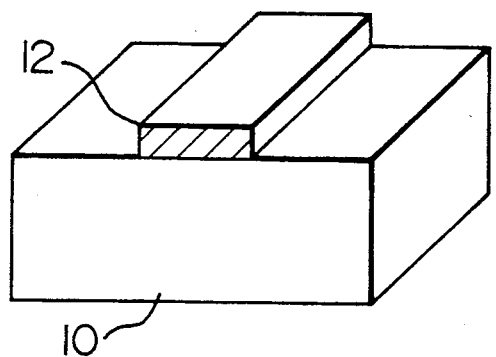
FIGS. 2A–2D are schematic oblique-projection cross-sectional views showing a method for producing the embodiment of FIG. 1A.

In embodiments shown in FIGS. 1A and 1B, a silicon substrate 10 has four side walls 23 extending substantially along respective crystal faces of (111) crystal orientation of the silicon. One pair of the side walls 23 extending substantially along the crystal faces crossing with each other is included on a sub-portion 15 of the silicon substrate 10, and another one pair of the side walls 23 extending substantially along the crystal faces crossing with each other is included on a main-portion 14 of the silicon substrate 10. The silicon substrate 10 has an silicon oxide layer 25 which extends from the side walls 23 and which is formed by oxidizing the silicon substrate 10 from the side walls 23 so that an electrically conductive or semi-conductive wire 31 or dot 32 in the sub-portion 15 is electrically partitioned from an electrically conductive or semi-conductive portion 24 in the main-portion 14 by the silicon oxide layer 25. Since the silicon substrate 10 is oxidized from the side walls 23 extending substantially along the crystal faces of (111) crystal orientation of the silicon, a boundary between the silicon oxide layer 25 and the electrically conductive or semi-conductive wire 31 or dot 32 can be correctly positioned, and has a flatness and linearity superior to those of the side walls 23.

In a method as shown in FIGS. 2A–2D, firstly, an upper surface along a crystal face of (100) crystal orientation of a silicon substrate 10 with an impurity or without the impurity is thermally oxidized by a depth of about 100 nm in a dry oxygen gas of 90° C. Subsequently, on the thermally oxidized upper surface, a rectangular resist mask is formed by a photolithography process. Two opposed sides of the rectangular resist mask extend substantially parallel or perpendicular to the <110> direction of the silicon substrate 10, that is, substantially parallel to an imaginary cross line formed by crystal faces of (111) crystal orientation of the silicon substrate 10. An angular error of each of the opposed sides of the rectangular resist mask relative to the <110> direction or the imaginary cross line within ±1 degree can be permitted. The thermally oxidized upper surface with the rectangular resist mask thereon is etched in $CF_4$ gas through a reactive ion etching process so that a part of the thermally oxidized upper surface on which the rectangular resist mask is arranged remains and another part of the thermally oxidized upper surface on which the rectangular resist mask is not arranged is removed by the etching to expose a new upper surface of the silicon substrate 10. The part of the thermally oxidized upper surface on which the rectangular resist mask is arranged forms an etching-resistant layer 12 on the silicon substrate 10, as shown in FIG. 2A. When the electrically conductive or semi-conductive quantum dot or line is desired, a width of the etching-resistant layer 12 must be adjusted and checked accurately.

Figure 2B:
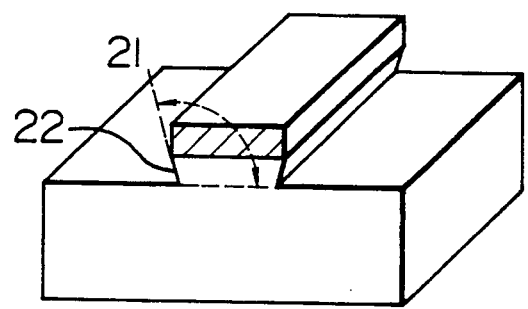

Subsequently, the new upper surface is etched and displaced through a silicon dry etching process, but, the silicon substrate 10 under the etching-resistant layer 12 is prevented from being etched through the silicon dry etching process by the etching-resistant layer 12, so that a difference in level of a boundary between the etching-resistant layer 12 and the silicon substrate 10 relative to the new upper surface after being etched and displaced is formed by 200 nm, and side walls 22 extending between the boundary and the new upper surface after being etched and displaced is formed, as shown in FIG. 2B. It is preferable for an angle 21 between each of the side walls 22 and the new upper surface after being etched and displaced to be 90°. Conditions for the silicon dry etching process using, for example, the reactive ion etching process, for obtaining the angle 21 of 90° are as follows:

A flow rate of ($SiCl_4$) gas: a flow rate of ($SF_6$) gas: a flow rate of ($CH_2F_2$) gas: a flow rate of ($O_2$) gas is 12:13:40:19, in an etching gas, a micro-wave electric power for energizing an electric discharge field in the gas is 160 W, a high-frequency energizing power for a reaction region is 40 W, and an etching rate of the silicon substrate 10 is about 500 nm/min.

Even if the angle 21 of 90° cannot be obtained, it is necessary for the angle 21 to be more than 90°.

Figure 2C:
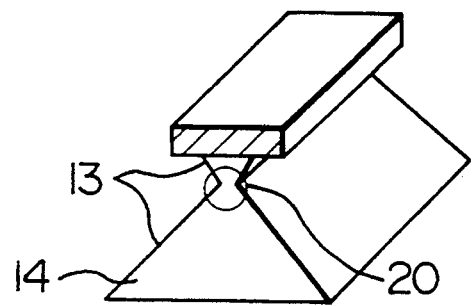
Figure 2D:
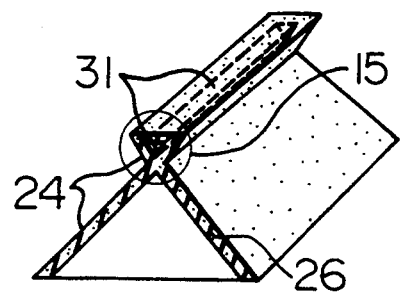
Figure 3A:
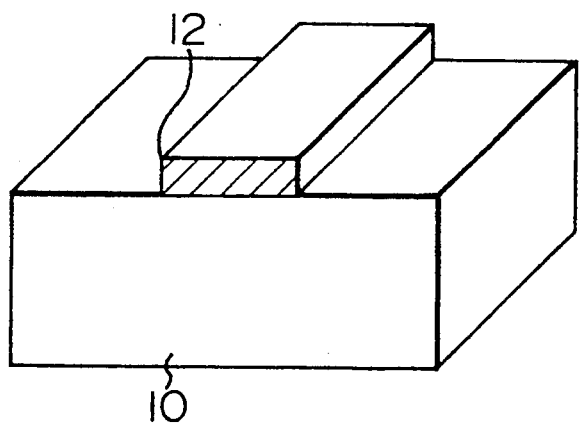
FIGS. 3A and 3B are schematic oblique-projection cross-sectional views showing a prior-art method for producing a silicon shape.
Figure 3B:
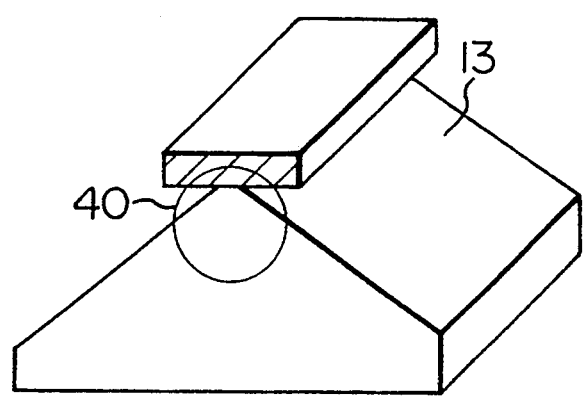

Subsequently, the new upper surface after being etched and displaced is further etched through a crystal anisotropic (wet chemical) etching process in which an etching rate or speed in a direction perpendicular to the crystal face of (111) Crystal orientation of the silicon substrate 10 is about 1/100 of an etching rate or speed in a direction perpendicular to the crystal face of (110) crystal orientation of the silicon substrate 10 and of an etching rate or speed in a direction perpendicular to the crystal face of (100) crystal orientation of the silicon substrate 10 so that a surface along the crystal face of (111) crystal orientation of the silicon substrate 10 remains and the other surfaces along the crystal faces of <110> crystal orientation and (100) crystal orientation of the silicon substrate 10 does not remain on the silicon substrate 10, after the crystal anisotropic etching process. Therefore, side walls 13 extending along the crystal faces of 111 crystal orientation of the silicon substrate 10 crossing each other remain to form a constricted neck portion 20 with a width of 10 nm so that the silicon substrate 10 is divided to a main part 14 and a sub-part 15 by the constricted neck portion 20, as shown in FIG. 2C. When the angle 21 is 90°, an intersecting line of the side walls 13 along the crystal faces of 111 crystal orientation of the silicon substrate 10 crossing each other in the constricted neck portion 20 is positioned at a substantially central level of the above mentioned difference in level of the boundary between the etching-resistant layer 12 and the silicon substrate 10 relative to the new upper surface after being etched and displaced. An angle between each of the side walls 13 along the crystal faces of 111 crystal orientation and the boundary along the crystal faces of 100 crystal orientation between the etching-resistant layer 12 and the silicon substrate 10 is 54.7°.

When an etchant mixture for the crystal anisotropy etching in which a mole percentage of ethylene-diamine ($NH_2(CH)_2NH_2$) is 43.8%, a mole percentage of pyrocatechol ($C_6H_5(OH)_8$) is 4.2%, and a mole percentage of pure water ($H_2O$) is 52% is used and a temperature thereof is 100° C., the etching rate or speed in the direction perpendicular to the crystal face of 111 crystal orientation of the silicon substrate 10 is 7 nm/min, that is, about 1/40 of the etching rate or speed in the direction perpendicular to the crystal face of 110 crystal orientation of the silicon substrate 10 and of the etching rate or speed in the direction perpendicular to the crystal face of 100 crystal orientation of the silicon substrate 10. Therefore, a shape of the constricted neck portion 20, particularly the width thereof, can be accurately adjusted by controlling a time of the crystal anisotropic etching. A linearity and flatness of each of the side walls 13 are improved by the crystal anisotropy etching in the direction perpendicular to the crystal faces of 111 crystal orientation, and a crystal damage or defect of the silicon substrate 10 caused by the dry etching process is removed by the crystal anisotropy etching. Therefore, a crystalline structure in the main part 14 and the sub-part 15 is substantially perfect.

Finally, the etching-resistant layer 12 is removed by hydrofluoric acid, and the silicon substrate 10 is thermally oxidized by a depth of about 50 nm from the side walls 13 thereof in a dry oxygen gas of 900° C. to form an oxidized layer 24 so that the constricted neck portion 20 is oxidized completely, an electrically conductive or semi-conductive portion 31 which is not oxidized to remain in the sub-part 15 is electrically separated and insulated from the main part 14, and a size of the electrically conductive or semi-conductive portion 31 which is not oxidized to remain in the sub-part 15 is minimized by the oxidation. Further, a flatness and linearity of a boundary between the oxidized layer 24 and the remaining electrically conductive or semi-conductive portion 31 are further improved in comparison with those of an outer shape of the side walls 13. An electrical potential barrier height of the oxidized layer 24 reaches about 3 eV.

The upper surface along the crystal face of 100 crystal orientation of the silicon substrate 10 may be oxidized for the etching-resistant layer 12 through a pyrogenic-oxidizing process or steam-oxidation process, instead of the oxidizing in the dry oxygen gas. Alternatively, a silicon-oxide layer or silicon-nitride layer for the etching-resistant layer 12 may be formed on the upper surface of the silicon substrate 10 through a low-pressure chemical vapor deposition (LPCVD), atmospheric pressure chemical vapor deposition (APCVD) or plasma vapor deposition process. A potassium hydroxide (KOH) solution or a mixture of hydrazine, isopropyl alcohol and pure water may be used as the etchant for the crystal anisotropic etching, instead of the ethylene-diamine type solution. The pyrogenic-oxidation process or steam oxidation process or plasma-oxidation process may be used for oxidizing the side walls 13 to form the oxidized layer 24, instead of the oxidizing in the dry oxygen gas.

Figure 4A:
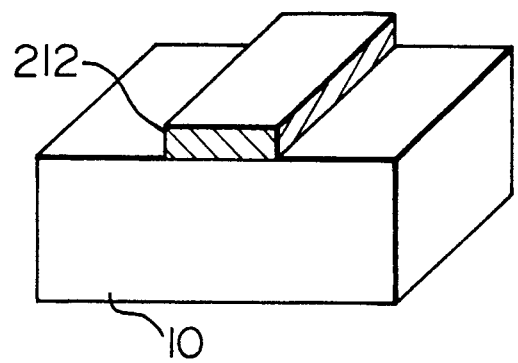
FIGS. 4A–4G are schematic oblique-projection cross-sectional views showing another method for producing another embodiment of the present invention.

In a method as shown in FIGS. 4A–4G, firstly, a silicon-nitride layer with a thickness of about 40 nm is formed through the low-pressure chemical vapor deposition (LPCVD) process on the upper surface along the crystal face of 100 crystal orientation of a silicon substrate 10 with the impurity or without the impurity. Subsequently, on the silicon-nitride layer, a rectangular resist mask is formed by a photolithography process. Two opposed sides of the rectangular resist mask extend substantially parallel or perpendicular to the axis of 110 crystal orientation of the silicon substrate 10, that is, substantially parallel to the imaginary cross line formed by the crystal faces of 111 crystal orientation of the silicon substrate 10. The silicon-nitride layer with the rectangular resist mask thereon is etched so that a part of the silicon-nitride layer on which the rectangular resist mask is arranged remains and another part of the silicon-nitride layer on which the rectangular resist mask is not arranged is removed by the etching to expose a new upper surface of the silicon substrate 10. The part of the silicon-nitride layer on which the rectangular resist mask is arranged forms an etching-resistant layer 212 on the silicon substrate 10, as shown in FIG. 4A.

Figure 4B:
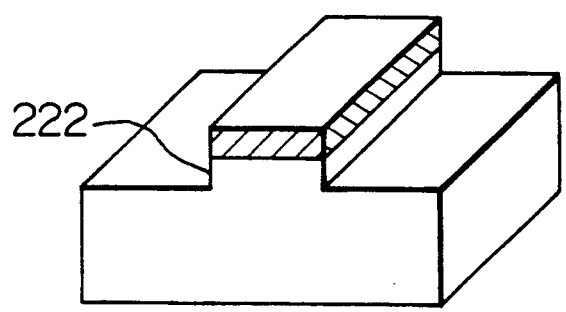

Subsequently, the new upper surface is etched and displaced through a silicon dry etching process, but, the silicon substrate 10 under the etching-resistant layer 212 is prevented from being etched through the silicon dry etching process by the etching-resistant layer 12, so that a difference in level of a boundary between the etching-resistant layer 212 and the silicon substrate 10 relative to the new upper surface after being etched and displaced is 200 nm, and side walls 222 extending between the boundary and the new upper surface after being etched and displaced are formed, as shown in FIG. 4B.

Figure 4C:
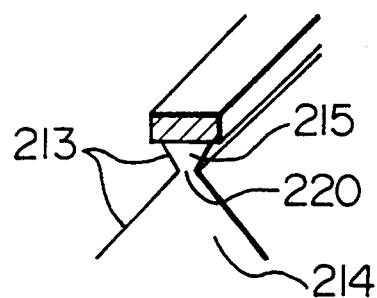

Subsequently, the new upper surface after being etched and displaced is further etched through the crystal anisotropic etching process. Therefore, side walls 213 extending along the crystal faces of 111 crystal orientation of the silicon substrate 10 crossing each other remains to form a constricted neck portion 220 with a width of 10 nm so that the silicon substrate 10 is divided to a main part 214 and a sub-part 215 by the constricted neck portion 220, as shown in FIG. 4C.

Figure 4D:
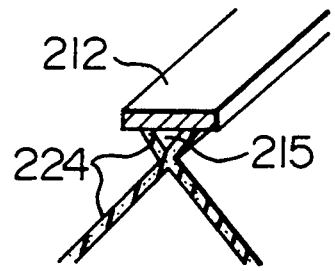

Subsequently, while the etching-resistant layer 212 remains on the sub-part 215, the silicon substrate 10 is thermally oxidized from the side walls 213 thereof in the dry oxygen gas of 900° C. to form an oxidized layer 224, so that an upper surface of the sub-part 215 is prevented from being oxidized by the silicon-nitride etching-resistant layer 212, the constricted neck portion 220 is oxidized completely, an electrically conductive or semi-conductive portion 231 which is not oxidized to remain in the sub-part 215 is electrically separated and insulated from the main part 214, and a size of the electrically conductive or semi-conductive portion 231 which is not oxidized to remain in the sub-part 215 is minimized by the oxidation, as shown in FIG. 4D. Further, a flatness and linearity of a boundary between the oxidized layer 224 and the remaining electrically conductive or semi-conductive portion 231 are further improved in comparison with those of an outer shape of the side walls 213.

Figure 4E:
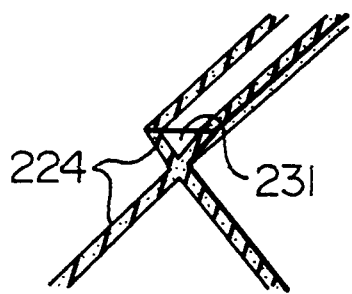

Subsequently, the silicon-nitride etching-resistant layer 212 is removed from the upper surface of the sub-part 215 by a thermal phosphoric acid solution so that the electrically conductive or semi-conductive portion 231 a part of which is surrounded by the oxidized layer 224 and another part of which is exposed as shown in FIG. 4E is formed.

If the resist mask is circular or square, the electrically conductive or semi-conductive portion 231 is a dot-like shape.

Figure 4F:
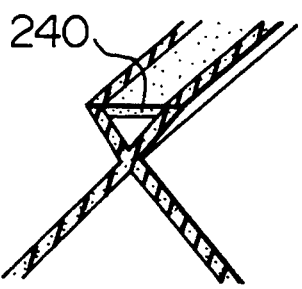
Figure 4G:
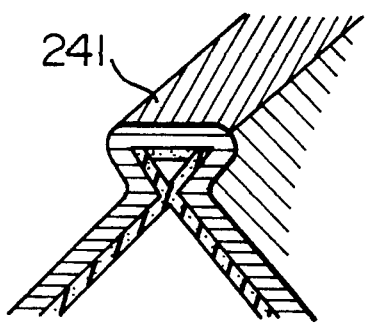

Subsequently, a thin oxide gate layer 240 with a thickness of 10 nm is formed as shown in FIG. 4F, by oxidizing thermally an upper surface of the electrically conductive or semi-conductive portion 231 in the oxygen gas of 900° C. Thereafter, an aluminum gate electrode layer 241 with a thickness of 500 nm is formed over the electrically conductive or semi-conductive portion 231 as shown in FIG. 4G, by sputtering.

Figure 5A:
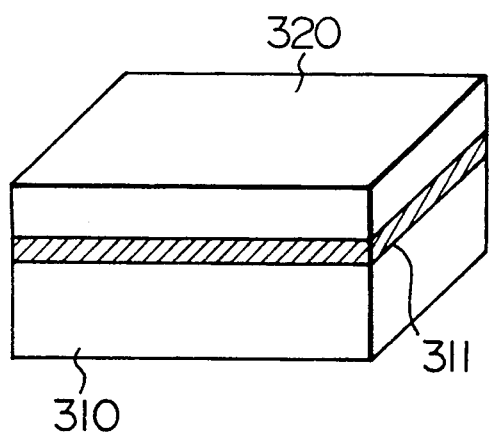
FIGS. 5A–5D are schematic oblique-projection cross-sectional views showing another method for producing another embodiment of the present invention.

In a method as shown in FIGS. 5A–5D, the present invention is applied to a semiconductor or insulator (SOI), whose structure is formed through a separation-by-implanted-oxygen (SIMOX) process. In the separation-by-implanted-oxygen process, after oxygen ions are inserted into a silicon substrate 310, by an ion implantation process with an oxygen ion dosing rate of $1.8*10^{18}$ cm$^{-2}$ and an accelerating voltage of 200 keV while keeping a temperature of the silicon substrate 310 at 500°–600° C., from an upper surface thereof extending along a crystal face of 100 crystal orientation of the silicon substrate 310 with an impurity or without the impurity, the silicon substrate 310 is treated with heat in a temperature of 1300° C. for six hours so that an embedded electrically insulating (silicon-oxide) layer 311 with a thickness of 0.4 μm is formed in the silicon substrate 310 and an upper silicon layer 320 of the silicon substrate 310 is electrically separated or insulated by the electrically insulating (silicon-oxide) layer 311 from the remaining portion of the silicon substrate 310, as shown in FIG. 5A. A thickness of the upper silicon layer 320 can be easily decreased to about 150 nm through a thermal oxidation and an etching process with a hydrofluoric acid.

Figure 5B:
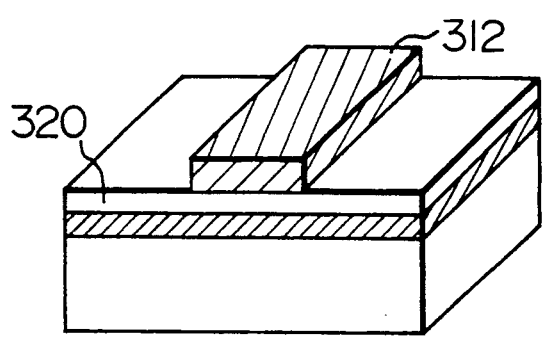

Subsequently, the upper silicon layer 320 is thermally oxidated by a depth of about 100 nm in a dry oxygen gas of 900° C. Subsequently, on the thermally oxidated upper surface, a rectangular resist mask is formed by a photolithography process. Two opposed sides of the rectangular resist mask extend substantially parallel or perpendicular to the <110> direction of the silicon substrate 310, that is, substantially parallel to an imaginary cross line formed by crystal faces of (111) crystal orientation of the silicon substrate 310. An angular error of each of the opposed sides of the rectangular resist mask relative to the <110> direction or the imaginary cross line within ±1 degree can be permitted. The thermally oxidated upper surface with the rectangular resist mask thereon is etched in CF$_4$ gas through the reactive ion etching process so that a part of the thermally oxidated upper surface on which the rectangular resist mask is arranged remains and another part of the thermally oxidated upper surface on which the rectangular resist mask is not arranged is removed by the etching to expose a new upper surface of the upper silicon layer 320. The part of the thermally oxidated upper surface on which the rectangular resist mask is arranged forms an etching-resistant layer 312 on the upper silicon layer 320, as shown in FIG. 5B. When the electrically conductive or semi-conductive quantum dot or wire is desired, a width of the etching-resistant layer 312 must be adjusted and checked accurately. An angular error of each of opposed sides of the etching-resistant layer 312 relative to the axis of 110 crystal orientation or the imaginary cross line is preferably maintained within ±1 degree.

Figure 5C:
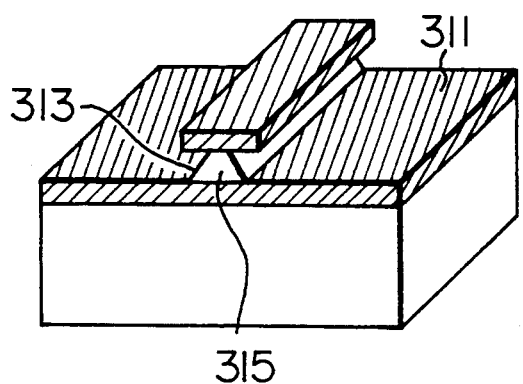
Figure 5D:
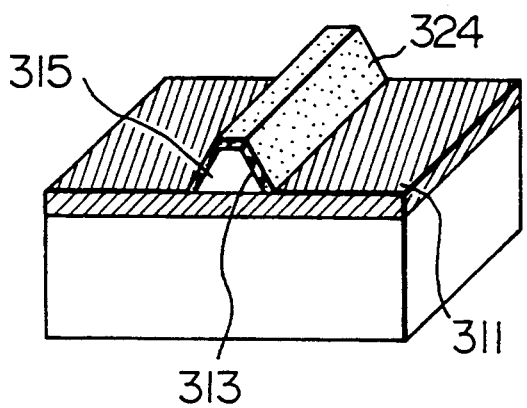

Subsequently, the new upper surface of the upper silicon layer 320 with the etching-resistant layer 312 thereon is etched through an anisotropic etching process in which the electrically insulating (silicon-oxide) layer 311 is not etched, an etching rate or speed in a direction perpendicular to the crystal face of 111 crystal orientation of the silicon substrate 310 or upper silicon layer 320 is about 1/100 of an etching rate or speed in a direction perpendicular to the crystal face of 110 crystal orientation of the silicon substrate 310 or upper silicon layer 320 and of an etching rate or speed in a direction perpendicular to the crystal face of 100 crystal orientation of the silicon substrate 310 or upper silicon layer 320 so that a surface along the crystal face of 111 crystal orientation of the silicon substrate 310 or upper silicon layer 320 remains and the other surfaces along the crystal faces of 110 crystal orientation and 100 crystal orientation of the silicon substrate 310 do not remain on the silicon substrate 310 or electrically insulating (silicon-oxide) layer 311, after the crystal anisotropy etching process. Therefore, side walls 313 of a part of the upper silicon layer 320 extending along the crystal faces of 111 crystal orientation of the silicon substrate 310 or upper silicon layer 320 crossing each other under the etching-resistant layer 312 remains on the electrically insulating silicon-oxide layer 311 to form a trapezoidal portion 315 under the etching-resistant layer 312, as shown in FIG. 5C. An angle between each of the side walls 313 and the electrically insulating silicon-oxide layer 311 is 54.7°, and a height of the trapezoidal portion 315 is equal to a thickness of the upper silicon layer 320.

When an etchant mixture for the anisotropic etching in which a mole percentage of ethylene-diamine ($NH_2(CH)_2NH_2$) is 43.8%, a mole percentage of pyrocatechol ($C_6H_5(OH)_8$) is 4.2%, and a mole percentage of pure water ($H_2O$) is 52% is used and a temperature thereof is 100° C., the etching rate or speed in the direction perpendicular to the crystal face of 111 crystal orientation of the silicon substrate 10 is 7 nm/min, that is, about 1/40 of the etching rate or speed in the direction perpendicular to the crystal face of 110 crystal orientation of the silicon substrate 10 and of the etching rate or speed in the direction perpendicular to the crystal face of 100 crystal orientation of the silicon substrate 10. Therefore, a shape of the trapezoidal portion 315, particularly the width thereof, can be accurately adjusted by controlling a time of the anisotropic etching. A linearity and flatness of each of the side walls 313 are improved by the crystal anisotropic etching in the direction perpendicular to the crystal faces of 111 crystal orientation.

Finally, the etching-resistant layer 312 is removed by a hydrofluoric acid, and the trapezoidal portion 315 is thermally oxidized by a depth of about 20 nm from the side walls 313 thereof in a dry oxygen gas of 900° C. to form an oxidized layer 324 in the trapezoidal portion 315 to leave an electrically conductive or semi-conductive portion which is not oxidized to remain in the trapezoidal portion 315, and a size of the electrically conductive or semi-conductive portion which is not oxidized to remain in the trapezoidal portion 315 is minimized by the oxidation. Further, a flatness and linearity of a boundary between the oxidized layer 324 in the trapezoidal portion 315 and the remaining electrically conductive or semi-conductive portion in the trapezoidal portion 315 are further improved in comparison with those of an outer shape of the side walls 313. An electrical potential barrier height of the oxidized layer 324 reaches about 3 eV.

A silicon layer as the upper silicon layer 320 on the electrically insulating layer 311 may be formed by recrystallization of a silicon layer onto a silicon-oxide layer, epitaxial growth of the silicon layer on the silicon-oxide layer or sticking together the silicon layer and the silicon-oxide layer. The upper surface of the upper silicon layer 320 may be oxidized for the etching-resistant layer 312 through a pyrogenic-oxidation process or steam-oxidation process, instead of the oxidizing in the dry oxygen gas. Alternatively, a silicon-oxide layer or silicon-nitride layer for the etching-resistant layer 312 may be formed on the upper surface of the upper silicon layer 320 through a low-pressure chemical vapor deposition (LPCVD), atmospheric pressure chemical vapor deposition (APCVD) or plasma vapor deposition process. A potassium hydroxide (KOH) solution or a mixture of hydrazine, isopropyl alcohol and pure water may be used as the etchant for the crystal anisotropic etching, instead of the ethylene-diamine type solution. The pyrogenic-oxidation process or steam-oxidation process or oxygen-plasma-gas-oxidation process may be used for oxidizing the side walls 313 to form the oxidized layer 324, instead of the oxidizing in the dry oxygen gas.

Figure 6A:
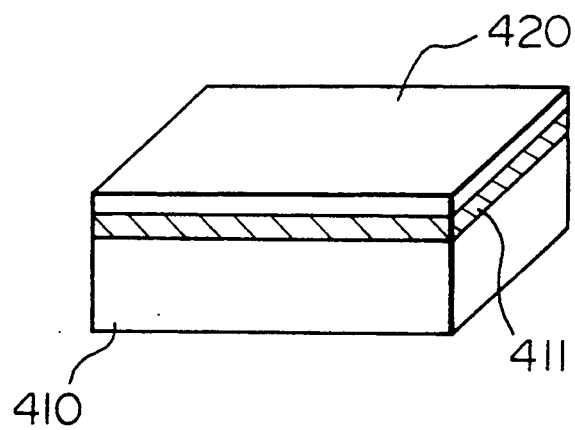
FIGS. 6A–6D are schematic oblique-projection views cross-sectional showing another method for producing another embodiment of the present invention.

In a method as shown in FIGS. 6A–6D, a silicon substrate 410 is treated for 45 minutes with heat of 950° C. in an electric furnace through which ($B_2H_6$) gas diluted to 1000 ppm with argon gas flows with a flow rate of 210 cm$^3$/min, oxygen gas flows with a flow rate of 13 cm$^3$/min and nitrogen gas flows with a flow rate of 1300 cm$^3$/min, so that an upper portion of the silicon substrate 410 is changed to a high-impurity-concentration P-channel layer 411. Subsequently, a boron glass formed on the high-impurity-concentration P-channel layer 411 during the above heat treatment is removed in a dark room by dilute hydrofluoric acid. Subsequently, a low temperature epitaxial growth of a low-impurity-concentration N-channel layer 420 by a thickness of about 150 nm on the high-impurity-concentration P-channel layer 411 is performed by a sputtering equipment in which a temperature of the silicon substrate 410 is about 300° C., bias voltage for the silicon substrate 410 is 5 V, RF power is 40 W, a target material is a monocrystalline silicone doped with phosphorus by about $10^{17}$ cm$^3$ and bias voltage for the target is 200 V, so that a sharp P-N junction is formed, as shown in FIG. 6A. In order to prevent the sharp P-N junction from being damaged, it is necessary for the silicon substrate 410 with the P-N junction to be treated under a low-temperature condition.

Subsequently, a silicon-oxide layer with a thickness of about 100 nm is formed over the low-impurity-concentration N-channel layer 420 in a temperature of 300° C. through the plasma chemical vapor deposition process.

Figure 6B:
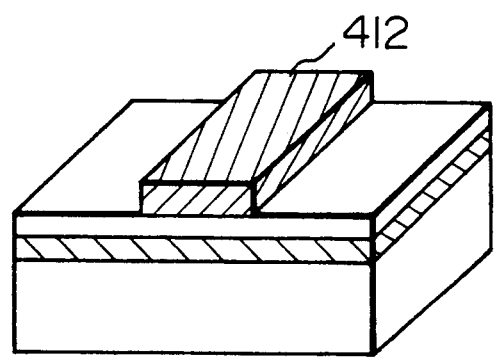

Subsequently, on the silicon-oxide layer over the low-impurity-concentration N-channel layer 420, a rectangular resist mask is formed by the photolithography process. Two opposed sides of the rectangular resist mask extend substantially parallel or perpendicular to the <110> direction of the low-impurity-concentration N-channel layer 420, that is, substantially parallel to an imaginary cross line formed by crystal faces of (111) crystal orientation of the low-impurity-concentration N-channel layer 420. An angular error of each of the opposed sides of the rectangular resist mask relative to the <110> direction or the imaginary cross line within ±1 degree can be permitted. The silicon-oxide layer with the rectangular resist mask thereon is etched in $CF_4$ gas through the reactive ion etching process so that a part of the thermally oxidized upper surface on which the rectangular resist mask is arranged remains and another part of the thermally oxidized upper surface on which the rectangular resist mask is not arranged is removed by the etching to expose a new upper surface of the low-impurity-concentration N-channel layer 420. The part of the thermally oxidized upper surface on which the rectangular resist mask is arranged forms an etching-resistant layer 412 on the low-impurity-concentration N-channel layer 420, as shown in FIG. 6B. When the electrically conductive or semi-conductive quantum dot or wire is desired, a width of the etching-resistant layer 412 must be adjusted and checked accurately.

Figure 6C:
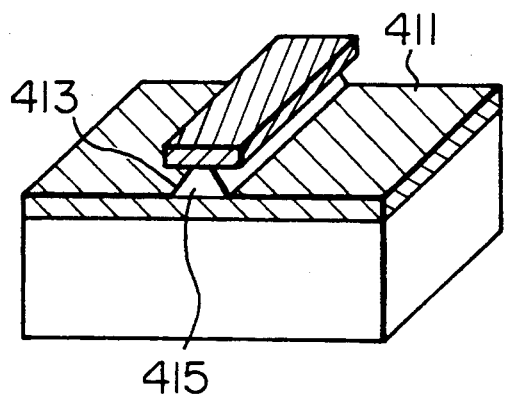
Figure 6D:
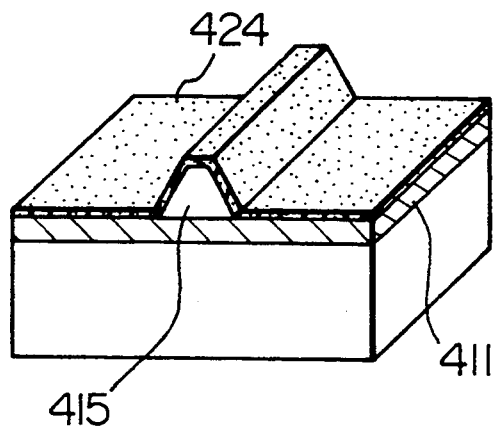

Subsequently, the new upper surface of the low-impurity-concentration N-channel layer 420 with the etching-resistant layer 412 thereon is etched through an anisotropic etching process in which the high-impurity concentration P-channel layer 411 with an impurity concertration of $10^{20} cm^{-3}$ is not etched, an etching rate or speed in a direction perpendicular to the crystal face of 111 crystal orientation of the low-impurity-concentration N-channel layer 420 is about 1/100 of the etching rate or speed in a direction perpendicular to the <110> direction of the low-impurity-concentration N-channel layer 420 and of an etching rate or speed in a direction perpendicular to the crystal face of (100) crystal orientation of the low-impurity-concentration N-channel layer 420 so that a surface along the crystal face of (111) crystal orientation of the low-impurity concentration N-channel layer 420 remains and the other surfaces along the crystal faces of (110) crystal orientation and (100) crystal orientation of the low-impurity-concentration N-channel layer 420 do not remain on the high-impurity-concentration P-channel layer 411, after the crystal anisotropic etching process. Therefore, side walls 413 of a part of the low-impurity-concentration N-channel layer 420 extending along the crystal faces of (111) crystal orientation of the low-impurity-concentration N-channel layer 420 crossing each other under the etching-resistant layer 412 remain on the high-impurity-concentration P-channel layer 411 to form a trapezoidal portion 415 under the etching-resistant layer 412, as shown in FIG. 6C. An angle between each of the side walls 413 and the high-impurity-concentration P-channel layer 411 is 54.7°, and a height of the trapezoidal portion 415 is equal to a thickness of the low-impurity-concentration N-channel layer 420.

When an etchant mixture for the anisotropic etching in which a mole percentage of ethylene-diamine ($NH_2(CH)_2NH_2$) is 43.8%, a mole percentage of pyrocatechol ($C_6H_5(OH)_8$) is 4.2%, and a mole percentage of pure water ($H_2O$) is 52% is used and a temperature thereof is 100° C., the etching rate or speed in the direction perpendicular to the crystal face of 111 crystal orientation of the low-impurity-concentration N-channel layer 420 is 7 nm/min, that is, about 1/40 of the etching rate or speed in the direction perpendicular to the crystal face of 110 crystal orientation of the low-impurity-concentration N-channel layer 420 and of the etching rate or speed in the direction perpendicular to the crystal face of 100 crystal orientation of the low-impurity-concentration N-channel layer 420. Therefore, a shape of the trapezoidal portion 415, particularly the width thereof, can be accurately adjusted by controlling a time of the crystal anisotropic etching. A linearity and flatness of each of the side walls 413 are improved by the crystal anisotropic etching in the direction perpendicular to the crystal faces of 111 crystal orientation.

Finally, the etching-resistant layer 412 is removed by a hydrofluoric acid, and an exposed surface of the trapezoidal portion 415 and an upper surface of the high-impurity-concentration P-channel layer 411 are oxidized in an oxygen plasma or an oxygen ion to form an oxidized layer 424 in the trapezoidal portion 415 to leave an electrically conductive or semi-conductive portion which is not oxidized to remain in the trapezoidal portion 415, and a size of the electrically conductive or semi-conductive portion which is hot oxidized to remain in the trapezoidal portion 315 is minimized by the oxidation. Further, a flatness and linearity of a boundary between the oxidized layer 424 in the trapezoidal portion 415 and the remaining electrically conductive or semi-conductive portion in the trapezoidal portion 415 are further improved in comparison with those of an outer shape of the side walls 413 by the oxidation. An electrical potential barrier height of the oxidized layer 424 reaches about 3 eV.

What is claimed is:

1. A silicon structure comprising:
   a silicon substrate;
   a plurality of insulating layers formed on said silicon substrate by oxidation of a portion of said silicon substrate, said insulating layers having respective surfaces which extend substantially along (111) crystal orientations of said silicon substrate, said silicon substrate having had (i) crystal faces which extended substantially along said (111) crystal orientations before said oxidation of said portion of the silicon substrate and (ii) a given flatness and linearity before said oxidation of said portion of said silicon substrate; and
   a quantum part disposed between at least two of the insulating layers, the quantum part having boundaries with the at least two of the insulating layers, said boundaries having at least one of a flatness and a linearity which is superior to said flatness or linearity previously had by said crystal faces of said silicon substrate before the oxidation of said portion of said silicon substrate.

2. A silicon structure comprising:
   a silicon substrate;
   four first insulating layers formed on said silicon substrate by oxidation of a first portion of said silicon substrate, said first insulating layers having respective first surfaces which extend substantially along (111) crystal orientations of said silicon substrate, said silicon substrate having had first crystal faces which extended substantially along said (111) crystal orientations before said oxidation of said portion of the silicon substrate;

a second insulating layer formed on said silicon substrate by oxidation of a second portion of said silicon substrate, said second insulating layer having a second surface which extends substantially along a (100) crystal orientation of said silicon substrate, said silicon substrate having had a second crystal face which extended substantially along said (100) crystal orientation before said oxidation of said second portion of the silicon substrate; and a quantum dot surrounded by the first insulating layers and the second insulating layer, the quantum dot having first boundaries which extend substantially along respective third crystal faces of (111) crystal orientation of the silicon substrate between the quantum dot and the first insulating layers and a second boundary which extends substantially along a fourth crystal face of (100) crystal orientation of the silicon substrate between the quantum dot and the second insulating layer.

3. A silicon structure comprising:

a silicon substrate;

two first insulating layers formed on said silicon substrate by oxidation of a first portion of said silicon substrate, said first insulating layers having respective first surfaces which extend substantially along (111) crystal orientations of said silicon substrate, said silicon substrate having had first crystal faces which extended substantially along said (111) crystal orientations before said oxidation of said portion of the silicon substrate;

a second insulating layer formed on said silicon substrate by oxidation of a second portion of said silicon substrate, said second insulating layer having a second surface which extends substantially along a (100) crystal orientation of said silicon substrate, said silicon substrate having had a second crystal face which extended substantially along said (100) crystal orientation before said oxidation of said second portion of the silicon substrate; and a quantum wire surrounded by the first insulating layers and the second insulating layer, the quantum wire having first boundaries which extend substantially along respective third crystal faces of (111) crystal orientation of the silicon substrate between the quantum wire and the first insulating layers and a second boundary which extends substantially along a fourth crystal face of (100) crystal orientation of the silicon substrate between the quantum wire and the second insulating layer.

4. A silicon structure comprising:

a silicon substrate;

two first insulating layers formed on said silicon substrate by oxidation of a first portion of said silicon substrate, said first insulating layers having respective first surfaces which extend substantially along (111) crystal orientations of said silicon substrate, said silicon substrate having had first crystal faces which extended substantially along said (111) crystal orientations before said oxidation of said first portion of the silicon substrate;

a second insulating layer formed on said silicon substrate by oxidation of a second portion of said silicon substrate, said second insulating layer having a second surface which extends substantially along a (100) crystal orientation of said silicon substrate, said silicon substrate having had a second crystal face which extended substantially along said (100) crystal orientation before said oxidation of said portion of the silicon substrate;

an electrically conductive layer; and a quantum wire surrounded by the electrically conductive layer, the first insulating layers and the second insulating layer, the quantum wire having first boundaries which extend substantially along respective third crystal faces of (111) crystal orientation of the silicon substrate between the quantum wire and the first insulating layers, a second boundary which extends substantially along a fourth crystal face of (100) crystal orientation of the silicon substrate between the quantum wire and the second insulating layer, and a third boundary which extends substantially along a fifth crystal face of (100) crystal orientation of the of the silicon substrate between the quantum wire and the electrically conductive layer.

5. A silicon structure comprising:

a silicon substrate;

two first insulating layers formed on said silicon substrate by oxidation of a first portion of said silicon substrate, said insulating layers having respective first surfaces which extend substantially along (111) crystal orientations of said silicon substrate, said silicon substrate having had first crystal faces which extended substantially along said (111) crystal orientations before said oxidation of said portion of the silicon substrate;

a second insulating layer formed on said silicon substrate by oxidation of a second portion of said silicon substrate, said second insulating layer having a second surface which extends substantially along a (100) crystal orientation of said silicon substrate, said silicon substrate having had a second crystal face which extended substantially along said (100) crystal orientation before said oxidation of said second portion of the silicon substrate;

a silicon oxide layer; and a quantum wire surrounded by the silicon oxide layer, the first insulating layers and the second insulating layer, the quantum wire having first boundaries which extend substantially along respective third crystal faces of (111) crystal orientation of the silicon substrate between the quantum wire and the first insulating layers, a second boundary which extends substantially along a fourth crystal face of (100) crystal orientation of the of the silicon substrate between the quantum wire and the second insulating layer, and a third boundary which extends substantially along a fifth crystal face of (100) crystal orientation of the of the silicon substrate between the quantum wire and the silicon oxide layer.

6. A silicon substrate according to claim 1, wherein the quantum part has at least one dimension not exceeding 100 nm.

7. A silicon substrate according to claim 2, wherein the quantum dot has at least one dimension not exceeding 100 nm.

8. A silicon substrate according to claim 3, wherein the quantum wire has at least one dimension not exceeding 100 nm.

9. A silicon substrate according to claim 4, wherein the quantum wire has at least one dimension not exceeding 100 nm.

10. A silicon substrate according to claim 5, wherein the quantum wire has at least one dimension not exceeding 100 nm.

11. A silicon substrate according to claim 4, wherein the electrically conductive layer comprises a high-impurity-concentration P-channel layer.

12. A silicon substrate according to claim 4, wherein the quantum wire comprises a low-impurity-concentration N-channel material.

13. A silicon substrate according to claim 12, wherein the low-impurity-concentration N-channel material is epitaxially grown on the electrically conductive layer.

14. A silicon substrate according to claim 1, wherein the quantum part is electrically conductive.

15. A silicon substrate according to claim 1, wherein the quantum part is semiconductive.

* * * * *